United States Patent [19]

Venkatesh

[11] Patent Number: 4,742,247
[45] Date of Patent: May 3, 1988

[54] CMOS ADDRESS TRANSITION DETECTOR WITH TEMPERATURE COMPENSATION

[75] Inventor: Bhimachar Venkatesh, Sunnyvale, Calif.

[73] Assignee: Advanced Micro Devices, Inc., Sunnyvale, Calif.

[21] Appl. No.: 727,502

[22] Filed: Apr. 26, 1985

[51] Int. Cl.⁴ .................................... H03K 5/153
[52] U.S. Cl. ................................. 307/231; 307/451; 307/517; 307/310; 307/591; 307/265
[58] Field of Search ............... 307/350, 517, 518, 351, 307/354, 463, 585, 310, 448, 449, 451, 591, 594, 595, 602, 605; 328/109, 115, 114, 116

[56] References Cited

U.S. PATENT DOCUMENTS

| | | | |
|---|---|---|---|
| 3,786,357 | 1/1974 | Belle Isle | 307/595 |
| 4,064,408 | 12/1977 | Hon et al. | 307/351 |
| 4,286,174 | 8/1981 | Ding Wall | 307/354 |
| 4,563,593 | 1/1986 | Isobe et al. | 328/114 |

OTHER PUBLICATIONS

Bingham, "CMOS: Higher Speeds, More Drive and Analog Capability Expand its Horizons", Electronic Design 23, Nov. 8, 1979, pp. 74–82.

Primary Examiner—Stanley D. Miller
Assistant Examiner—Timothy P. Callahan
Attorney, Agent, or Firm—Patrick T. King; Davis Chin

[57] ABSTRACT

A CMOS address transition detector includes a first input circuit section, a first delay circuit section, a second input circuit section, a second delay circuit section and an output circuit section. The first input circuit section and the first delay circuit section are responsive to true address transition signals for controlling the pulse width of an output pulse signal. The second input circuit section and the second delay circuit section are responsive to a false address transition signal for controlling the pulse width of the output signal. The output circuit section generates at an output terminal the output pulse signal having a pulse width which is substantially constant over a wide temperature range. The output circuit section has a first input which is responsive to the first input circuit section and the first delay circuit section when the true address transition signal makes a low-to-high transition. The output circuit section has a second input which is responsive to the second input circuit section and the second delay circuit section when the false address transition signal makes a low-to-high transition.

14 Claims, 2 Drawing Sheets (a) +135°C  -Vcc = 4.5V (b) +35°C - Vcc = 4.5V (c) -55°C -Vcc = 4.5V

CMOS ADDRESS TRANSITION DETECTOR WITH TEMPERATURE COMPENSATION

BACKGROUND OF THE INVENTION

This invention relates generally to transition detector circuits, and more particularly, it relates to a CMOS address transition detector for generating an output pulse signal having a pulse width which is substantially constant over a wide temperature range.

Transition detector circuits are generally well known in the art for detecting logic transitions in an input signal and frequently used in computer data processing systems. However, the prior art detector circuits suffer from one or more shortcomings which have not been solved heretofore. One of the major problems experienced in the prior art detector circuits is that the output pulse produced has a pulse width which varies greatly over the temperature range for military specification of $-55°$ C. to $+135°$ C. Another problem is that many such detector circuits have a slow response time, i.e., a relatively long propagation delay between the occurrence of an address transition and the generation of the output pulse. Another difficulty associated with these prior art circuits is that they tend to consume considerable amounts of power since they have been generally formed by using bipolar or NMOS technologies.

It would therefore be desirable to provide an address transition detector for generating an output pulse signal having a pulse width which remains substantially constant with temperature variations. Further, it would be desirable to have an address transition detector which has a fast response time and has low power dissipation. The address transition detector of the present invention is constructed in fully complementary-metal-oxide-semiconductor (CMOS) devices and are connected so that no direct current path exists between the power supply and ground resulting in practically no power being consumed between input address transitions. Further, the instant address transition detector utilizes temperature compensated active resistors for controlling the output pulse width to be substantially constant over temperature variations.

SUMMARY OF THE INVENTION

Accordingly, it is a general object of the present invention to provide a CMOS address transition detector for generating an output pulse signal having a stable pulse width.

It is an object of the present invention to provide a CMOS address transition detector circuit which has a relatively high speed of operation for generating an output pulse signal.

It is another object of the present invention to provide a CMOS address transition detector having a constant pulse width which has a fast response time and has low power dissipation.

It is still another object of the present invention to provide a CMOS address transition which includes first and second RC delay circuit sections for controlling the pulse width of an output pulse signal.

It is yet still another object of the present invention to provide a CMOS address transition detector which includes RC delay circuit sections formed of a temperature compensated active resistor for controlling the pulse width of an output pulse signal.

In accordance with these aims and objectives, the present invention is concerned with the provision of a CMOS address transition detector which includes a first input circuit section, a first delay circuit section, a second input circuit section, a second delay circuit section and an output circuit section. The first input circuit section and first delay circuit section are responsive to a true address transition signal for controlling the pulse width of an output pulse signal. The second circuit section and the second delay circuit section are responsive to a false address transition signal for controlling the pulse width of the output pulse signal. The output circuit section generates the output pulse signal having a pulse width which is substantially constant over a wide temperature range. The output circuit section is responsive to the first input circuit section and the first delay circuit section when the true address transition signal makes a low-to-high transition. The output circuit section is responsive to the second input circuit section and the second delay circuit section when the false output transition signal makes a low-to-high transition.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
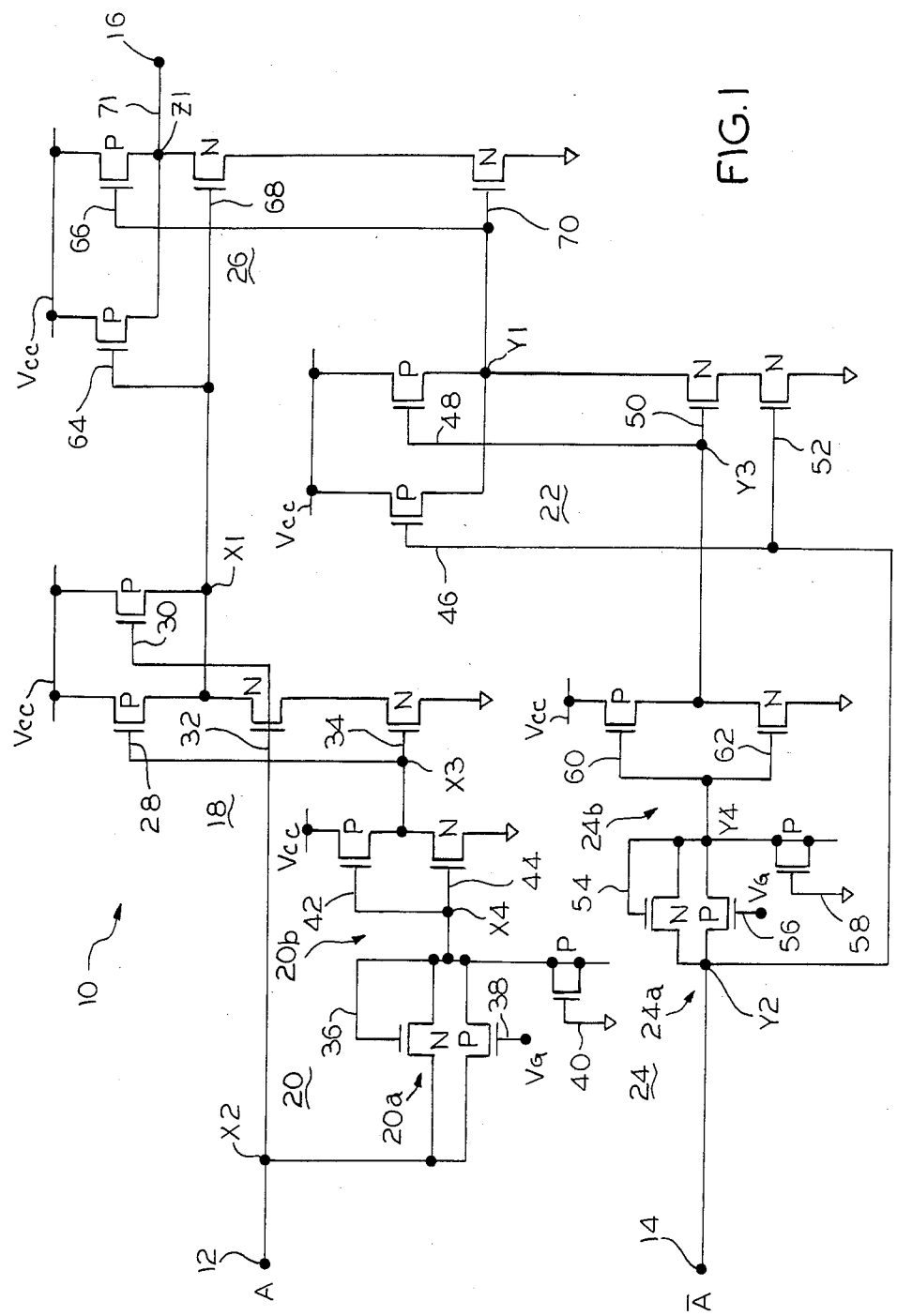
FIG. 1 shows a detailed schematic circuit diagram of the CMOS address transition detector of the present invention.

Referring now to FIG. 1, there is shown a schematic circuit diagram of a CMOS address transition detector 10 for generating an output pulse signal in accordance with the principles of the present invention. The address transition detector 10 receives a true address transition input signal A at input terminal 12 and a false or complement address transition input signal $\overline{A}$ at input terminal 14. Typically, the input signal A and its inverted input signal $\overline{A}$ have a logic "1" voltage level on the order of 5.0 volts $\pm 10\%$ and a logic "0" voltage level on the order of 0 volts. These input signals are provided at outputs of or internal to an address buffer circuit (not shown) which makes either a high-to-low transition or a low-to-high transition. Of course, when the input signal A is making a low-to-high transition, the inverted input signal $\overline{A}$ is making a high-to-low transition and vice versa. In response to these input signals, the address transition detector generates an output pulse signal at output terminal 16. Typically, the output signal has a logic "1" level which approaches the power supply voltage or in this case $\pm 4.5$ volts and a logic "0" level which will be near ground level or in this instance, 0 volts.

The address transition detector 10 includes a first input circuit section 18, a first delay circuit section 20, a second input circuit section 22, a second delay circuit section 24, and an output circuit section 26. The first input circuit section 18 includes a pair of P-channel MOS transistors 28 and 30 having their sources connected to a supply voltage or potential VCC. The supply voltage is preferably operated at 5.0 volts±10%. The drains of the transistors 28 and 30 are also connected together and to a node X1 which serves as the output of the first input circuit section 18. The circuit section 18 further includes a pair of N-channel MOS transistors 32 and 34. The transistor 32 has its drain connected to the common drains of the transistors 28 and 30 and its source connected to the drain of the transistor 34. The source of the transistor 34 is connected to a ground potential. The gates of the transistors 30 and 32 are tied together and to the input terminal 12 via a node X2. The gates of the transistors 28 and 34 are tied together and to a node X3. A first input of the first circuit section 18 is defined by the common gates (node X2) of the transistors 30 and 32. A second input of the first circuit section 18 is defined by the common gates (node X3) of the transistors 28 and 34.

The first delay circuit section 20 is formed of a RC delay portion 20a and an inverter portion 20b. The RC delay portion 20a consists of a N-channel MOS transistor 36, a P-channel MOS transistor 38 and a P-channel MOS transistor 40. The source of the transistor 36 and the drain of the transistor 38 are connected together and to the node X2. The gate and drain electrodes of the transistors 36 are tied together and to the source of the transistor 38 which is in turn connected to node X4. The transistor 40 has its source and drain electrodes connected together and its gate connected to the ground potential so as to function as a capacitor. The common source and drain electrodes of the transistor 40 are also tied to the node X4. The gate of the transistor 38 has applied to it a stable reference voltage $V_G$ which will vary with temperature but will be substantially constant independent of supply voltage fluctuations at a given temperature. With this reference voltage applied to the gate of the P-channel MOS transistor 38, there will be provided a temperature compensated active resistor whose resistance value will remain substantially constant with temperature variations. The details of the circuit construction and its operation for this resistor is described and claimed in my co-pending application entitled "Temperature Compensated Active Resistor" which is assigned to the same assignee of this application. Such co-pending application is hereby incorporated by reference. This RC delay portion 20a serves to control the pulse width of the output pulse signal which will remain substantially constant over variations in temperature.

The inverter portion 20b consists of a P-channel MOS transistor 42 and a N-channel MOS transistor 44 whose gates are connected together and to the node X4 and whose drains are connected together and to the node X3. The source of the transistor 42 is tied to the supply potential VCC, and the source of the transistor 44 is tied to the ground potential.

The second input circuit section 22 is identical in construction to the first input circuit section 18 and includes a pair of P-channel MOS transistors 46 and 48 having their sources connected to the supply voltage or potential VCC. The drains of the transistors 46 and 48 are also connected together and to a node Y1 which serves as the output of the second input circuit section 22. The circuit section 22 further includes a pair of N-channel MOS transistors 50 and 52. The transistor 50 has its drain connected to the common drains of the transistors 46, 48 and its source connected to the drain of the transistor 52. The source of the transistor 52 is connected to the ground potential. The gates of the transistors 46 and 52 are tied together and to the input terminal 14 via a node Y2. The gates of the transistors 48 and 50 are tied together and to a node Y3. A first input of the second circuit section 22 is defined by the common gates (node Y2) of the transistors 46 and 52. A second input of the second circuit section 22 is defined by the common gates (node Y3) of the transistors 48 and 50.

The second delay circuit section 24 is identical in construction to the first delay circuit section 20 and includes a RC delay portion 24a and an inverter portion 24b. The RC delay portion 24a consists of a N-channel MOS transistor 54, a P-channel MOS transistor 56 and a P-channel MOS transistor 58. The source of the transistor 54 and the drain of the transistor 56 are connected together and to the node Y2. The gate and drain electrodes of the transistor 54 are connected together and to the source of the transistor 56 which is in turn connected to a node Y4. The transistor 58 has its source and drain electrodes connected together and its gate connected to the ground potential so as to function as a capacitor. The common source and drain electrodes of the transistor 58 are also tied to the node Y4. The gate of the transistor 56 has applied to it the same reference voltage $V_C$ which was applied to the gate of the transistor 38. With this reference voltage applied to the gate of the P-channel MOS transistor 56, it will function as a temperature compensated active resistor. This RC delay portion 24a serves to control the pulse width of the output pulse signal which will remain substantially constant over variations in temperature.

The inverter portion 24b consists of a P-channel MOS transistor 60 and a N-channel MOS transistor 62 whose gates are connected together and to the node Y4 and whose drains are connected together and to the node Y3. The source of the transistor 60 is tied to the supply potential VCC, and the source of the transistor 62 is tied to the ground potential.

The output circuit section 26 includes a pair of P-channel MOS transistors 64 and 66 having their sources connected to the supply potential VCC. The drains of the transistors 64, 66 are also connected together and to a node Z1. The node Z1 serves as the output of the output circuit section and is connected via lead 71 to the output terminal 16. The output terminal 16 generates the output pulse signal in response to a low-to-high transition occurring either at the input terminal 12 or at the input terminal 14. The output circuit section 26 further includes a pair of N-channel MOS transistors 68 and 70. The transistor 68 has its drain connected to the common drains of the transistor 64, 66 and its source connected to the drain of the transistor 70. The source of the transistor 70 is connected to the ground potential. The gates of the transistor 64 and 68 are tied together defining a first input of the output circuit section 26 and to the output of the first input circuit section 18 at the node X1. The gates of the transistors 66 and 70 are tied together defining a second input of the output circuit section and to the output of the second input circuit section at the node Y1.

Figure 2:
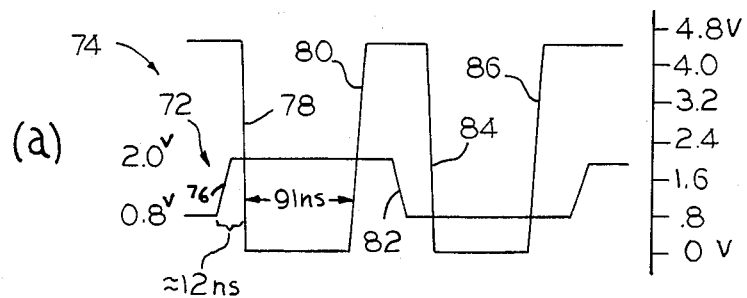
FIG. 2(a)–(c) show waveforms useful in understanding the operation of the transition detector illustrated in FIG. 1.
Figure 2:
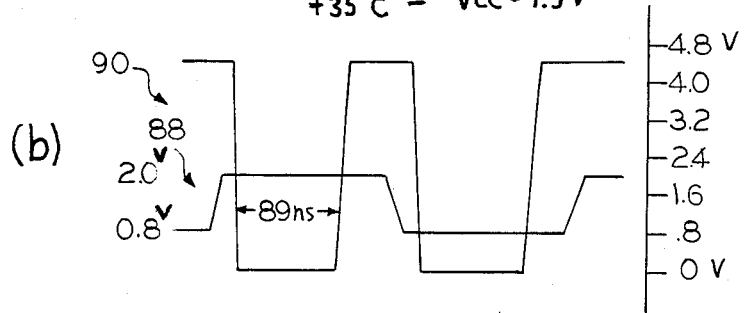
Figure 2:
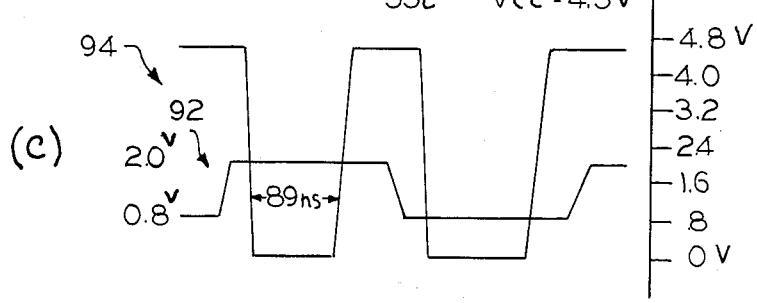

The operation of the address transition detector 10 will now be explained with reference to the waveform diagrams shown in FIG. 2. In FIG. 2(a) there is illustrated a waveform 72 representing an address input to the input of the address buffer (not shown) for generating the address transition input signals A and $\bar{A}$ which are applied to the address transition detector via terminals 12 and 14 respectively. It should be noted that the transition signal A will be logically identical to the address input while the transition signal $\overline{A}$ will be logically inverted or a complement of the address input. As can be seen, the address input swings between 0.8 volts representing the logic "0" level and 2.0 volts representing the logic "1" level. A waveform 74 represents the output of the address transition detector 10 at the output terminal 16 in response to the address transition input signals A and $\overline{A}$ at the temperature of $\pm 135°$ C. with a power supply voltage of 4.5 volts.

When the address input makes a low-to-high transition (edge 76), the output circuit section 26 will be responsive to the first input circuit section 18 and the first delay circuit section 20 which receives the transition signal A. The second input circuit section 22 and the second delay circuit section 24 will be inactivated. As a result, the output waveform 74 will make a high-to-low transition (edge 78) after approximately 12 nanosecond propagation delay. The waveform 74 will now remain in the low logic level for a given amount of time which is controlled by the first delay circuit section 20 and will then switch back to the high logic level (edge 80). The pulse width or the time between the edges 78 and 80 is approximately 91 nanoseconds.

When the address input makes a high-to-low transition (edge 82), this causes the address transition input signal $\overline{A}$ to make a low-to-high transition. The output circuit section 26 will be responsive to the second input circuit section 22 and the second delay circuit section 24 which receives the transition signal $\overline{A}$. The first circuit section 18 and the first delay circuit section 20 will be inactivated. As a result, the output waveform will again make a high-to-low transition (edge 84) after a 12 nanosecond time delay. The waveform 74 will again remain in the low logic level for a given amount of time which is controlled by the second delay circuit section 24 and will switch back to the high logic level (edge 86). The pulse width or the time between the edges 84 and 86 is approximately 91 nanoseconds.

FIG. 2(b) illustrates a waveform 88 representing the address input and a waveform 90 representing the output pulse signal of the address transition detector in response to the waveform 88 at the temperature of $\pm 35°$ C. with a power supply voltage of $\pm 4.5$ volts. Since the operation is identical to that described previously with respect to FIG. 2(a), it will not be repeated. However, it should be noted that the pulse width is approximately 89 nanoseconds which is very close to the same pulse width obtained at $\pm 135°$ C. in FIG. 2(a).

FIG. 2(c) illustrates a waveform 92 representing the address input and a waveform 94 representing the output pulse signal of the address transition detector in response to the waveform 92 at the temperature of $-55°$ C. with a power supply voltage of $\pm 4.5$ volts. Again, the operation is identical to what was described with respect to FIG. 2(a) and thus will not be repeated. It can be seen that the pulse width is approximately 89 nanoseconds which is identical to the pulse width obtained at $\pm 35°$ C. in FIG. 2(b).

In view of this operation just described, it will be noted that the address transition detector 10 always makes a high-to-low transition each time the address input changes either going low-to-high or high-to-low. The pulse width is substantially constant over variations in temperature due to the first and second delay circuit sections each of which includes a temperature compensated active resistor. Further, the generation of the output pulse signal from the address transition detector in response to the input address transition has a minimal propagation delay of approximately 12 nanoseconds.

The CMOS address transition detector of the present invention has the following advantages over the prior art designs:

(a) it uses fully CMOS technologies which has a high speed of operation and consumes a small amount of power;

(b) it uses temperature compensated active resistors for controlling the output pulse width so as to be substantially constant in spite of temperature variations; and (c) it provides an output pulse signal in response in an address transition after a minimal propagation delay.

From the foregoing detailed description it can thus be seen that the present invention provides an improved CMOS address transition detector for generating an output pulse signal having a pulse width which is substantially constant over a wide temperature range. The pulse width is controlled by the use of temperature compensated active resistors provided in the first and second delay circuit sections of the address transistion detector.

While there has been illustrated and described what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A CMOS address transition detector comprising:
   first input means having first and second inputs and an output, said first input of said first input means being responsive to a true address transition signal; said first input means including first and second P-channel MOS transistors having their sources connected to a supply potential, the drains of said first and second P-channel transistors being connected together and defining said output of said first input means, and first and second N-channel MOS transistors, said first N-channel transistor having its drain connected to the drains of said first and second P-channel transistors and its source connected to the drain of said second N-channel transistor, the source of said second N-channel transistor being connected to a ground potential, the gate of said first N-channel transistor being connected to the gate of said second P-channel transistor and defining the first input of said first input means, the gate of said second N-channel transistor being connected to the gate of said first P-channel transistor and defining the second input of said first input means;
   first delay means for controlling the pulse width of an output signal of the transition detector, said first delay means having its input coupled to said first input of said first input means and being responsive to the true address transition signal and having its output coupled to said second input of said first input means;

second input means having a first and second input and an output, said first input of said second input means being responsive to a false address transition signal;

said second input means including third and fourth P-channel MOS transistors having their sources connected to the supply potential, the drains of said third and fourth P-channel transistors being connected together and defining said output of said second input means, and third and fourth N-channel MOS transistors, said third N-channel transistor having its drain connected to the drains of said third and fourth P-channel transistors and its source connected to the drain of said fourth N-channel transistor, the source of said fourth N-channel transistor being connected to the ground potential, the gate of said third N-channel transistor being connected to the gate of said fourth P-channel transistor and defining the first input of said second input means, the gate of said fourth N-channel transistor being connected to the gate of said third P-channel transistor and defining the second input of said second input means;

second delay means controlling the pulse width of the output pulse signal of the transition detector, said second delay means having its input coupled to said first input of said second input means and being responsive to the false address transition signal and having its output coupled to said second input of said second input means;

said first delay means being formed of a first RC delay portion and a first inverter portion, said first delay portion including a fifth N-channel MOS transistor, a sixth P-channel MOS transistor, and a seventh P-channel MOS transistor, the sources of said fifth N-channel transistor being connected to the drain of said sixth P-channel transistor and defining the input of said first delay means, the gate and drain of the fifth N-channel transistor being connected together and to the source of the sixth P-channel transistor, the gate of said sixth P-channel transistor being adapted to receive a reference voltage, said sixth P-channel transistor functioning as a temperature compensated active resistor, said seventh P-channel transistor having its source and drain connected together and to the source of said sixth P-channel transistor and its gate connected to the ground potential and functioning as a capacitor;

said first inverter portion having an input coupled to the source of said sixth P-channel transistor and an output defining the output of said first delay means; and output means for generating at an output terminal the output pulse signal having a pulse width which is substantially constant over a wide temperature range, said output means having a first input coupled to the output of said first input means and being responsive to said first input means when said true address transistion signal makes a low-to-high transition, said output means having a second input coupled to the output of said second input means and being responsive to said second input means when said false address transition signal makes a low-to-high transition, the output pulse signal making a high-to-low transition when either said true or false address transition signal makes the low-to-high transition.

2. An address transition detector circuit as claimed in claim 1, wherein said first inverter portion comprises a P-channel MOS transistor and an N-channel MOS transistor having their gates connected together and to the source of said sixth P-channel transistor, said P-channel and N-channel transistors having their drains connected together and defining the output of said first delay means, the source of said P-channel transistor of said first inverter portion being connected to the supply potential and the source of said N-channel transistor being connected to the ground potential.

3. An address transition detector circuit as claimed in claim 2, wherein said second delay means comprises a second RC delay portion and a second inverter portion.

4. An address transistion detector as claimed in claim 3, wherein said second delay means includes a sixth N-channel MOS transistor, an eighth P-channel MOS transistor and a ninth P-channel MOS transistor, the source of said sixth N-channel transistor being connected to the drain of said eighth P-channel transistor and defining said input of said second delay means, the gate and drain of said sixth N-channel transistor being connected together and to the source of said eighth P-channel transistor, the gate of said eight P-channel transistor being adapted to receive the reference voltage, said eighth P-channel transistor functioning as temperature compensated active resistor, said ninth P-channel transistor having its source and drain connected together and to the source of said eighth P-channel transistor and its gate connected to the ground potential and functioning as a capacitor.

5. An address transition detector circuit as claimed in claim 7, wherein said second inverter portion has an input coupled to the source of said eight P-channel transistor and an output defining the output of said second delay means, and wherein said second inverter portion comprises a P-channel MOS transistor and an N-channel MOS transistor having their gates connected together and to the source of said eighth P-channel transistor, said P-channel and N-channel transistors having their drains connected together and defining the output of said second delay means, the source of said P-channel transistor of said second inverter portion being connected to the supply potential and the source of said N-channel transistor being connected to the ground potential.

6. An address transition detector circuit as claimed in claim 5, wherein said output means comprises first and second P-channel MOS transistors having their sources connected to the supply potential, the drains of said first and second P-channel MOS transistors being connected together defining said output terminal, and first and second N-channel MOS transistors, said first N-channel transistor having its drain connected to the drains of said P-channel transistors and its source connected to the drain of said second N-channel transistor, the source of said second N-channel transistor being connected to the ground potential, the gate of said first N-channel transistor being connected to the gate of said first P-channel transistor and defining said first input of said output means, the gate of said second N-channel transistor being connected to the gate of said second P-channel transistor defining said second input of said output means.

7. An address transition detector as claimed in claim 1, wherein said supply potential is approximately ±4.5 volts.

8. An address transition detector as claimed in claim 1, wherein said true and false address transition signals have a logic "1" level on the order of ±5.0 volts ±10% and a logic "0" level on the order of 0 volts.

9. An address transition detector circuit as claimed in claim 1, wherein said output pulse signal has a logic "1" level on the order of ±4.5 volts and a logic "0" level near ground potential.

10. An address transition detector circuit as claimed in claim 1, wherein said temperature range is between −55° C. and +135° C.

11. A CMOS address transition detector comprising:
first circuit means being responsive to a true address transition signal for controlling the pulse width of an output pulse signal of the transition detector;
said first circuit means including a first RC delay portion formed of a first temperature compensated actives resistor and a first capacitor serving to control the pulse width of the output pulse signal of the transition detector;
second circuit means being responsive to a false address transition signal for controlling the pulse width of the output pulse signal of the transition detector;
said second circuit means including a second RC delay portion formed of a second temperature compensated active resistor and a second capacitor serving to control the pulse width of the output pulse signal of the transition detector; and
output circuit means for generating the output pulse signal having a pulse width which is substantially constant over a wide temperature range, said output means having a first input responsive to said first circuit means when said true address transition signal makes a low-to-high transition, said output means having a second input being responsive to said second circuit means when said false address transition signal makes a low-to-high transition, the output pulse signal making a high-to-low transition when either said true or false address transition signal makes the low-to-high transition.

12. An address transition detector as claimed in claim 11, wherein said first resistor is formed of a P-channel MOS transistor having its gate tied to a stable reference voltage which is independent of supply voltage variations.

13. An address transition detector as claimed in claim 12, wherein said second resistor is formed of a P-channel MOS transistor having its gate tied to a stable reference voltage which is independent of supply voltage variations.

14. An address transition detector as claimed in claim 11, wherein said temperature range is between −55° C. and ±135° C.

* * * * *